United States Patent
Keegan et al.

(10) Patent No.: US 9,281,762 B2
(45) Date of Patent: Mar. 8, 2016

(54) SYSTEMS AND METHODS FOR MANUFACTURING A PRE-CHARGE CIRCUIT MODULE

(71) Applicant: ROCKWELL AUTOMATION TECHNOLOGIES, INC., Mayfield Heights, OH (US)

(72) Inventors: Jeremy Jon Keegan, Kewaskum, WI (US); Yogesh Patel, Grafton, WI (US); Bruce William Weiss, Milwaukee, WI (US); James Allen Carter, Wauwatosa, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 303 days.

(21) Appl. No.: 14/073,625

(22) Filed: Nov. 6, 2013

(65) Prior Publication Data

US 2015/0124412 A1    May 7, 2015

(51) Int. Cl.
*H02M 7/5387* (2007.01)
*H05K 5/02* (2006.01)
*H05K 13/00* (2006.01)
*H05K 7/14* (2006.01)

(52) U.S. Cl.
CPC ........... *H02M 7/5387* (2013.01); *H05K 7/1432* (2013.01); *H05K 13/00* (2013.01); *Y10T 29/49117* (2015.01)

(58) Field of Classification Search
CPC ... H05K 13/0486; H05K 7/1432; H02H 7/09; H02H 7/122
See application file for complete search history.

(56) References Cited

U.S. PATENT DOCUMENTS

| | | | | |
|---|---|---|---|---|
| 7,684,199 | B2 * | 3/2010 | Yee | H02B 1/36 361/608 |
| 8,243,422 | B2 * | 8/2012 | Leeman | H02B 1/36 200/50.17 |
| 8,248,761 | B2 * | 8/2012 | Leeman | H02B 1/36 200/50.08 |
| 8,810,998 | B2 * | 8/2014 | Feldmeier | H02B 1/36 312/223.1 |
| 8,953,296 | B2 * | 2/2015 | Weiss | H02H 7/125 361/114 |
| 9,042,146 | B2 * | 5/2015 | Weiss | H02H 7/09 363/131 |
| 2015/0098257 | A1 * | 4/2015 | Wei | H05K 7/1432 363/37 |
| 2015/0256112 | A1 * | 9/2015 | Weiss | H02H 7/09 318/51 |

* cited by examiner

*Primary Examiner* — Robert J Hoffberg
(74) *Attorney, Agent, or Firm* — Fletcher Yoder P.C.

(57) ABSTRACT

Systems, methods, and devices are provided for coupling a direct current (DC) pre-charging circuit to a motor drive. In one embodiment, an industrial automation device may include an enclosed module that may include a pre-charge circuit. The pre-charge circuit may pre-charge a direct current (DC) bus. Further, the DC bus may couple to an inverter. The enclosed module may also include a power input that may couple the pre-charge circuit to a DC power source and an electrical output structure that may couple the pre-charge circuit to the inverter. Additionally, the pre-charge circuit may be removeably coupled to the inverter and the DC power source via a sliding action of the enclosed module.

20 Claims, 9 Drawing Sheets

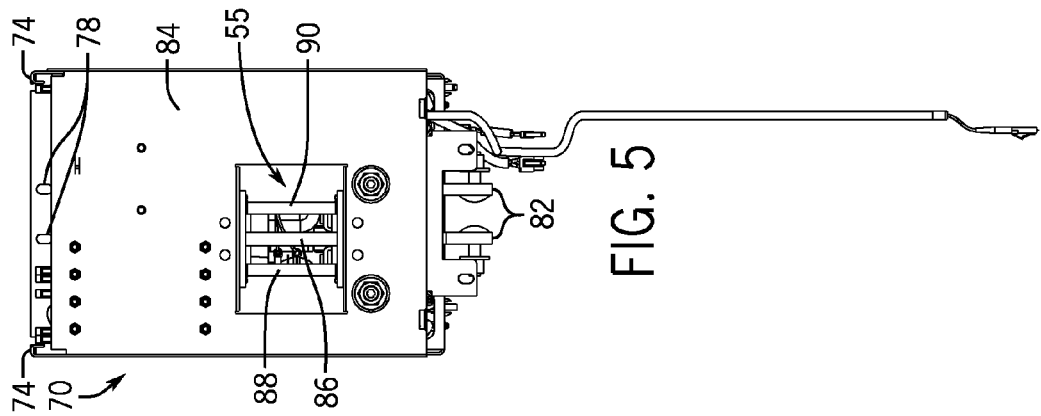
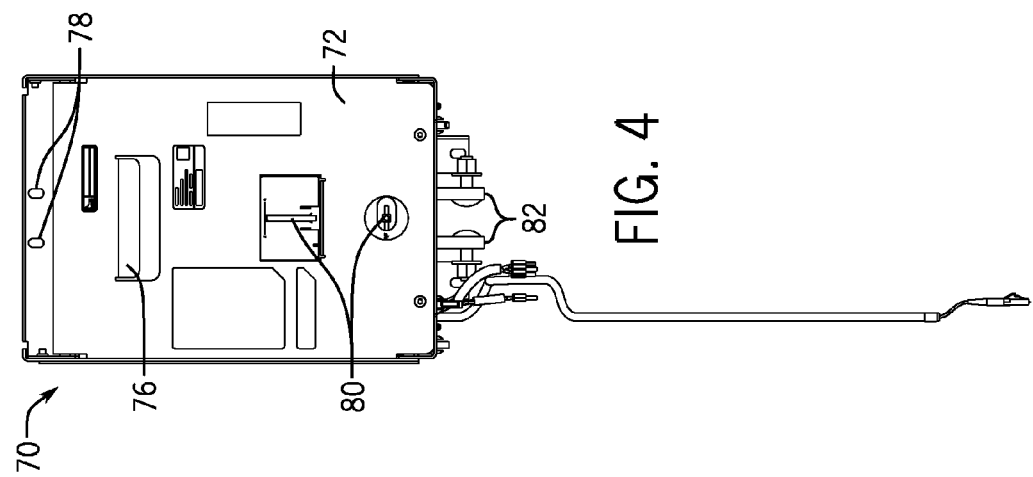
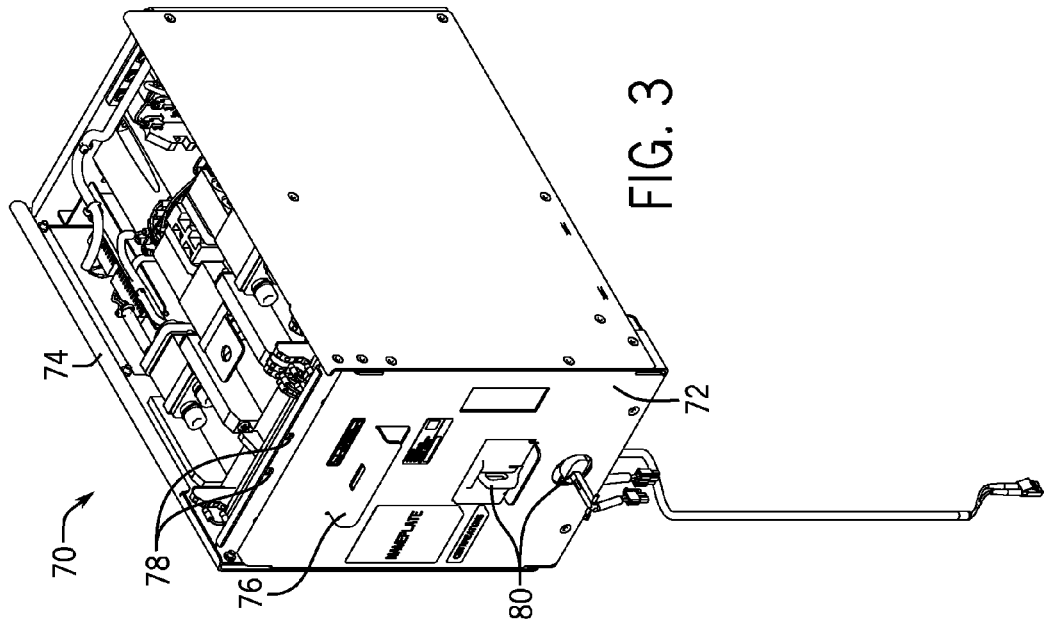

SYSTEMS AND METHODS FOR MANUFACTURING A PRE-CHARGE CIRCUIT MODULE

BACKGROUND

The present disclosure relates generally to the field of electrical drives. More particularly, the present disclosure relates to a modular embodiment of a pre-charge circuit for pre-charging a direct current (DC) bus in a power electronic device, such as an electrical drive.

In the field of power electronic devices, a wide range of circuitry is known and currently available for converting, producing, and applying power to loads. Depending upon the application, motor drive systems may include circuitry that converts incoming power from one form to another as used by the load. In a typical drive system, for example, a rectifier converts alternating current (AC) power (such as from a utility grid or generator) to direct current (DC) power. Inverter circuitry can then convert the DC power into a controllable AC power having a particular frequency for driving a motor at a particular speed. The inverter circuitry typically includes several high power switches, such as insulated-gate bipolar transistors (IGBTs), that are controlled by drive circuitry. Motor drive systems also often include power-conditioning circuitry, including capacitors and/or inductors, which may remove undesirable ripple currents from a DC bus coupled to a motor drive system.

During operation of a motor drive system, and particularly during start-up, high levels of in-rush current may be received by a motor drive in the motor drive system. The high levels of in-rush current may cause various adverse effects to the motor drive. To avoid these high levels of in-rush current during start-up, a typical motor drive system may include pre-charge circuitry that applies an initial current to the DC bus of the motor drive system prior to actually coupling a power source to the motor via the DC bus. As such, the pre-charge circuitry may charge a number of capacitors coupled to the DC bus before applying a full source voltage from the power source to the inverter via the DC bus. Such techniques may be referred to as pre-charging the DC bus.

Typical pre-charge circuitry may include components of a pre-charge circuit mounted on a flat array. Mounting the components on a flat array, however, may not be an efficient use of space. Moreover, mounting the components in this manner may also make replacing components of the pre-charge device challenging. As such, improved systems and methods for manufacturing pre-charge circuitry are desirable.

BRIEF DESCRIPTION

Certain embodiments commensurate in scope with the originally claimed invention are summarized below. These embodiments are intended only to provide a brief summary of possible forms of the invention. Indeed, the invention may encompass a variety of forms that may be similar to or different from the embodiments set forth below.

The present disclosure relates generally to a systems and methods for manufacturing a pre-charge circuit for pre-charging a DC bus of a motor drive system. Specifically, the pre-charge circuit may be a modular structure that may couple the pre-charge circuit to an inverter module, such that the pre-charge circuit module and the inverter module may be enclosed within the same power cabinet. Moreover, by using a modular structure to house the pre-charge circuit, a user may more efficiently access the pre-charge circuit for service or may quickly interchange an entire module for various reasons.

In one embodiment, an industrial automation device may include an enclosed module that may include a pre-charge circuit that may pre-charge a direct current (DC) bus. The DC bus may couple to an inverter. The enclosed module may also include a power input having a positive stab and a negative stab that may to couple the pre-charge circuit to a DC power source and an electrical output structure that may couple the pre-charge circuit to an inverter. The pre-charge circuit may be removeably coupled to the inverter and the DC power source via a sliding action of the enclosed module.

In another embodiment, a method may include sliding a modular device into a power cabinet to couple a positive stab and a negative stab of the modular device to a power interface of a power source. The modular device may include a pre-charge circuit that may pre-charge a DC bus that may couple to the power source and the modular device. Further, the method may include sliding an inverter module into the power cabinet to couple an input of the inverter module to an output of the modular device. The inverter module may include at least one capacitor that may be charged via the pre-charge circuit, such that the at least one capacitor may be coupled across the DC bus.

In yet another embodiment, a power system may include a pre-charge module. The pre-charge module may include a direct current (DC) pre-charge circuit that may couple to a DC bus, a positive power stab and a negative power stab that may couple the pre-charge module to a DC power source, at least two slide out rail supports, and an electrical output. Further, the power system may include an inverter module. The inverter module may include an electrical input that may couple to the electrical output of the pre-charge module, at least one capacitor coupled across the DC bus that may be charged via the DC pre-charge circuit, and an inverter circuit. The power system may also include a power cabinet. The power cabinet may include a power interface that may receive the positive stab and the negative power stab, at least two slide out rails that may receive the slide out rail supports of the pre-charge module, and a space that may receive the pre-charge module and the inverter module.

DRAWINGS

These and other features, aspects, and advantages of the present invention will become better understood when the following detailed description is read with reference to the accompanying drawings in which like characters represent like parts throughout the drawings, wherein:

FIG. 3 is a front perspective view of a DC pre-charge module enclosing the pre-charge circuitry of FIG. 2, in accordance with an embodiment;

FIG. 4 is a front view of a DC pre-charge module enclosing the pre-charge circuitry of FIG. 2, in accordance with an embodiment;

FIG. 5 is a rear view of a DC pre-charge module enclosing the pre-charge circuitry of FIG. 2, in accordance with an embodiment;

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Devices, systems, and methods of the present disclosure are related to pre-charging a DC bus on a motor drive in a motor drive system. During operation of a motor drive system, and particularly during start-up, motor drive circuitry (e.g., inverter, capacitors) may draw high levels of in-rush current while charging power-conditioning capacitors associated with the motor drive. Typically, motor drive configurations may include pre-charge circuitry that may apply an initial current to the DC bus of the motor drive prior to starting the motor drive. The initial current may be substantially smaller than the in-rush current and may charge DC capacitors (i.e., power-conditioning capacitors) that may be coupled to the DC bus. Pre-charging the capacitors with the initial current may protect the capacitors from possible damage that may be caused by the high levels of in-rush current during start-up.

Keeping the foregoing in mind, embodiments of the present disclosure include a module that may enclose pre-charge circuitry that may control current provided to the DC capacitors of a motor drive system during start-up, during line voltage sags during drive operation, and when isolating a drive from a common DC bus under certain fault conditions. Furthermore, in some embodiments, the pre-charge circuitry may utilize automatic switches, such as molded case switches, to isolate the motor drive without the use of a circuit breaker. Such a module may be sufficiently compact to fit in a single power cabinet with an inverter module of a motor drive system.

Figure 1:
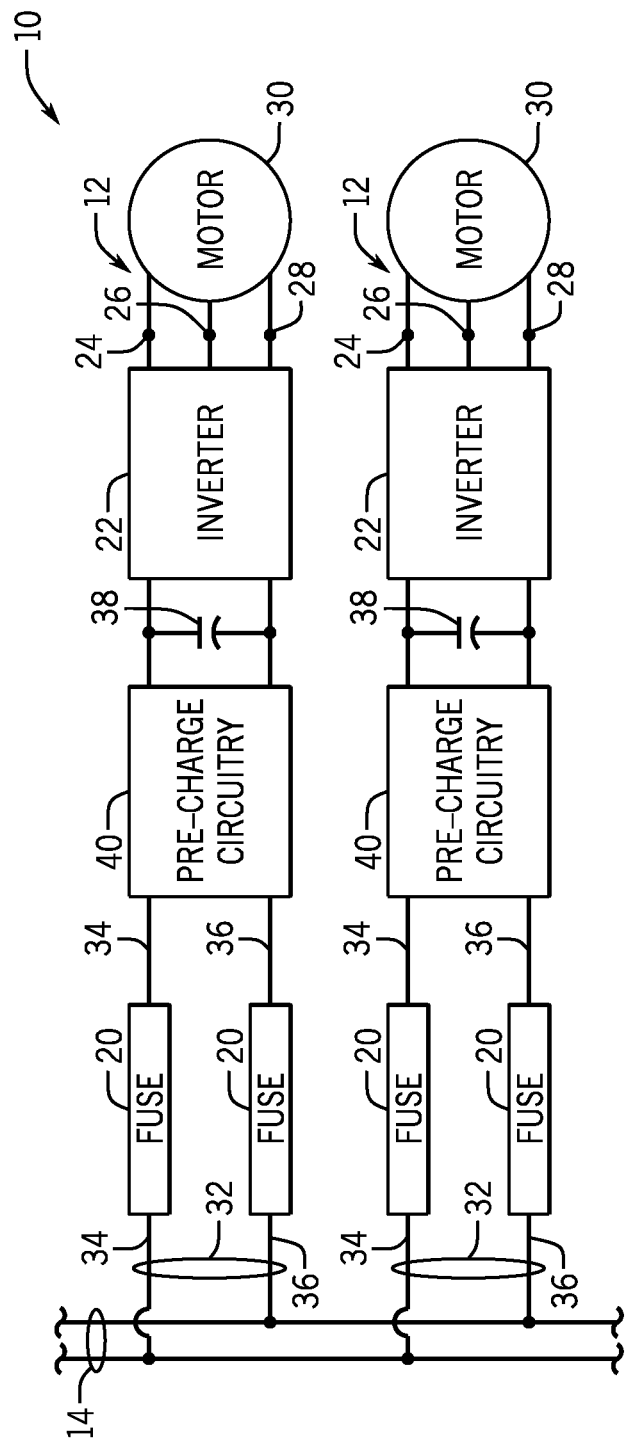
FIG. 1 is a diagrammatical representation of a power distribution network, in accordance with an embodiment.

By way of introduction, FIG. 1 is a diagrammatical representation of a power distribution network 10 in accordance with an embodiment of the systems and techniques described herein. The power distribution network 10 may include one or more motor drives 12 coupled to a common bus 14 through a direct current (DC) bus 32 having a positive side (+v) 34 and negative side (-v) 36. As shown in FIG. 1, the DC bus 14 may provide power to several motor drives 12. It should be noted, however, that in some embodiments, the DC bus 14 may be dedicated to a single motor drive 12. The DC bus 14 may be powered by any DC source known in the art, such as a battery, a solar panel, or a rectifier source. In some embodiments the rectifier source may be an 18-pulse, active front-end rectifier.

The motor drive 12 may include an inverter 22 that may generate a three phase output waveform at a desired frequency for driving a motor 30 connected to the output terminals 24, 26 and 28. The motor drive 12 may also include a capacitor 38 connected between the positive side 34 of the DC bus 32 and the negative side 36 of the DC bus 32. In some embodiments, the capacitor 38 may filter noise present in a DC voltage waveform by removing alternating current (AC) ripples from the common DC bus 14, such that the DC bus may carry a waveform closely approximating a true DC voltage.

In some embodiments, the motor drive 12 may include a pre-charge circuit 40 that may reduce an in-rush current that may occur when a power source is first coupled to the motor drive 12. A high in-rush current can be facilitated, in part, by the capacitor 38, which may briefly behave like a short-circuit after voltage is applied to the local DC bus 32 and before the capacitor 38 has stored a sufficient charge. Generally, the pre-charge circuit 40 may reduce he in-rush current by charging the capacitor 38 during an initial charging stage by providing a current to the capacitor 38 until the capacitor 38 charges to some voltage.

In some embodiments, each motor drive 12 may include a fuse 20 on each of the positive side 34 and negative side 36 of the DC bus 32. The fuse 20 may be suitable for providing load-breaking capabilities for components in the pre-charge circuit 40, as will be discussed in greater detail below. The fuse 20 may be a resistor or any suitable sacrificial device that provides current protection (e.g., during a short circuit) to components in the pre-charge circuit 40.

Figure 2:
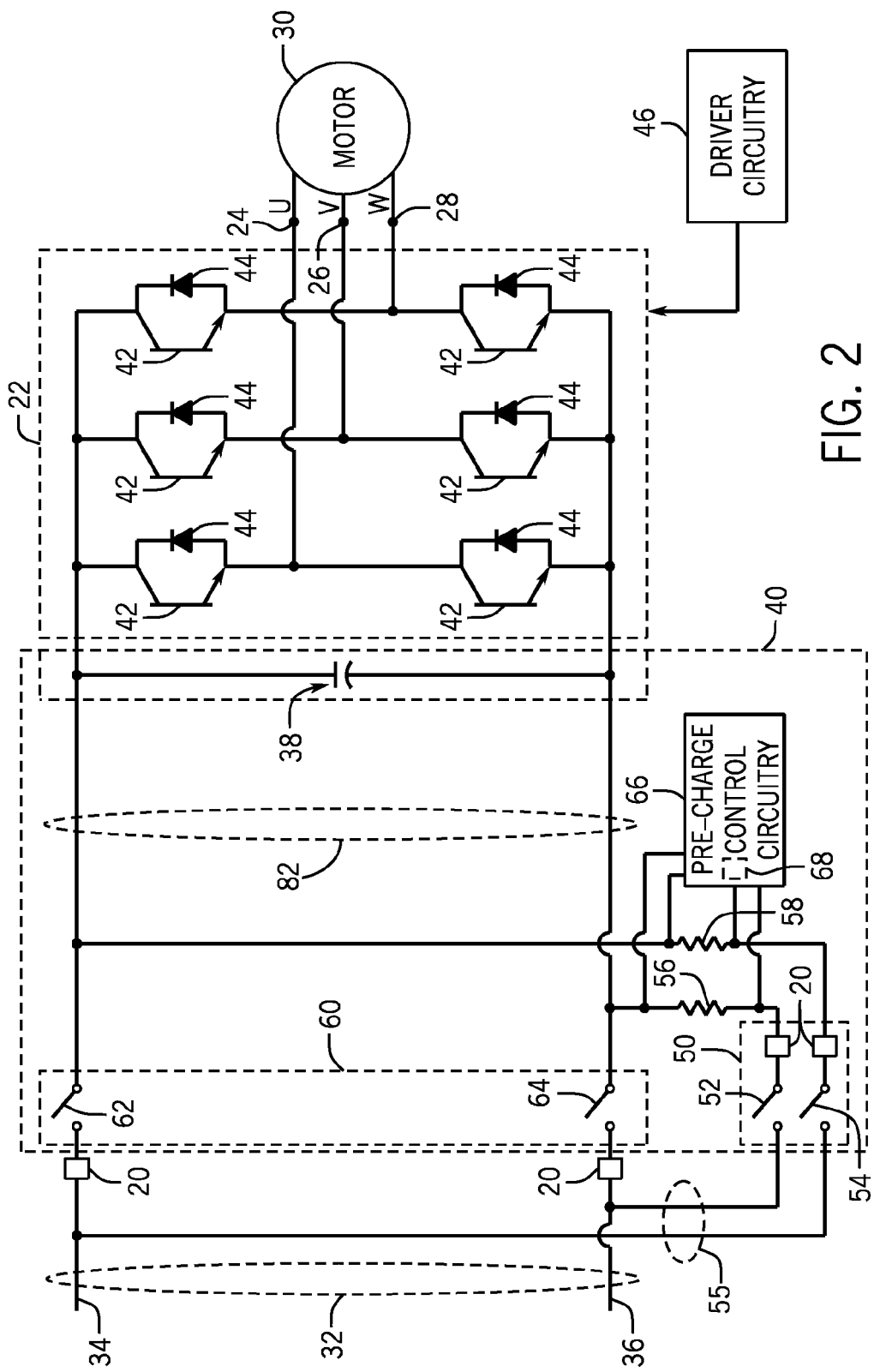
FIG. 2 is a diagrammatical representation of pre-charge circuitry in the power distribution network of FIG. 1, in accordance with an embodiment.

FIG. 2 is a diagrammatical representation of a portion of the motor drive 12 illustrated in FIG. 1 that employs the pre-charge circuitry 40. The motor drive 12 may include an inverter 22 having an arrangement of solid state switches 42, such as power metal-oxide semiconductor field-effect transistors (MOSFETs), insulated gate bipolar junction transistors (IGBTs), and the like. In some embodiments, a pair of switches 42 may be coupled in series (e.g., collector to emitter) between the positive side 34 and the negative side 36 of the internal DC bus 32. Further, the positive side 34 and the negative side 36 of the DC bus 32 may be coupled to a power input 55 of the pre-charge circuitry 40. In the illustrated embodiment of FIG. 2, three of these pairs of switches 42 are coupled in parallel to the internal DC bus 32 for a total of six switches 42. Each switch 42 is arranged in parallel and in an opposite direction with respect to a diode 44. For instance, the collector of the switch 42 is coupled to the anode of the diode 44 and the emitter of the switch 42 is coupled to the cathode of the diode 44. Each of the output terminals 24, 26, and 28 is coupled to one of the switch outputs between one of the pairs of switches 42. Furthermore, driver circuitry 46 may be coupled to the inverter 22 to generate a three-phase output waveform. In some embodiments, the driver circuitry 46 may be connected to each of the switches 42 to cause the switches 42 to switch rapidly in a particular sequence to generate an approximately sinusoidal output waveform.

The inverter 22 may be connected to the internal DC bus 32 at output 82 of the pre-charge circuitry 40, and the inverter 22 may include a capacitor 38 that may be coupled in parallel with the pre-charge circuitry 40. The pre-charge circuitry 40 may include manual switches 50. The manual switches 50 may include a positive side manual switch 54 connected in series with pre-charge resistor 58 and coupled in parallel with the positive side 34 of the DC bus 32. The manual switches 50 may also include a negative side manual switch 52 connected in series with pre-charge resistor 56 and coupled in parallel with the negative side 36 of the DC bus 32. The pre-charge circuitry 40 may also include automatic switches 60 including a positive side automatic switch 62 on the positive side 34 of the DC bus 32 and a negative side automatic switch 64 on the negative side 36 of the DC bus 32. The automatic switches 60 may be controlled by pre-charge control circuitry 66 in the pre-charge circuitry 40. The pre-charge control circuitry 66 may include a communication component, a processor, a memory, a storage, input/output (I/O) ports, and the like. The communication component may be a wireless or wired communication component that may facilitate communication between the pre-charge control circuitry 66, the manual switches 50, the automatic switches 60, and the like. The processor may be any type of computer processor or microprocessor capable of executing computer-executable code. The memory and the storage may be any suitable articles of manufacture that can serve as media to store processor-executable code. These articles of manufacture may represent computer-readable media (i.e., any suitable form of memory or storage) that may store the processor-executable code used by the processor to perform the presently disclosed techniques.

In some embodiments, the automatic switches 60 may include a motorized molded case switch. The pre-charge control circuitry 66 may control the opening or closing of the automatic switches 60 by applying power to a coil or motor of the automatic switches 60. The pre-charge control circuitry 66 may be connected to each side of the pre-charge resistors 56 and 58 to sense a voltage drop across the pre-charge resistors 56 and 58. Based on the sensed voltage drop, the pre-charge control circuitry 66 may control the opening or closing of the automatic switches 60. In some embodiments, the pre-charge control circuitry 66 may also include a transformer 68 that may provide power to various components in the pre-charge circuitry 40. For instance, the transformer 68 may provide power to one or more coils or motors that may be used for closing or opening the automatic switches 60.

Generally, while the capacitor 38 charges during a pre-charge operation, the manual switches 50 may be closed while the automatic switches 60 may be open, and the pre-charge control circuitry 40 may deliver power through the closed manual switches 50. Because the automatic switches 60 may be open, the pre-charge current may flow through the closed manual switches 50 and the pre-charge resistors 56 and 58, and the current draw on the DC bus 32 may be adjusted to an acceptable value known in the art while the capacitor 38 charges. After a suitable time period has elapsed, or after the DC bus 32 reaches a threshold voltage (i.e., as measured across the pre-charge resistors 56 and 58), the pre-charge control circuitry 66 may close the automatic switches 60 to bypass the pre-charge resistors 56 and 58, thereby automatically disconnecting the pre-charge resistors 56 and 58 from the motor drive 12. Because the capacitor 38 will have been charged to a voltage (i.e., threshold voltage) approximately equal to the DC bus voltage, the inverter 22 may avoid receiving excessive in-rush currents.

In some embodiments, a fuse 20 may be coupled on each of the positive side 34 and negative side 36 of the DC bus 32 between the manual switches 50 and the automatic switches 60. For example, a first fuse 20 may be positioned between the positive side automatic switch 62 and the positive side manual switch 54 and a second fuse 20 may be between the negative side automatic switch 64 and the negative side manual switch 52. The fuse 20 may be any suitable element (e.g., a resistor, a sacrificial wire) suitable for providing load-breaking capabilities for the automatic switches 60. In some instances, such as during a short circuit, the fuse 20 may disconnect the automatic switches 62 and 64 from the power source to protect the automatic switches 62 and 64 from the short circuit. Furthermore, in some embodiments, fuses 20 may also be coupled in series with the manual switches 50 to protect the manual switches 50 from influxes of current.

Figure 6:
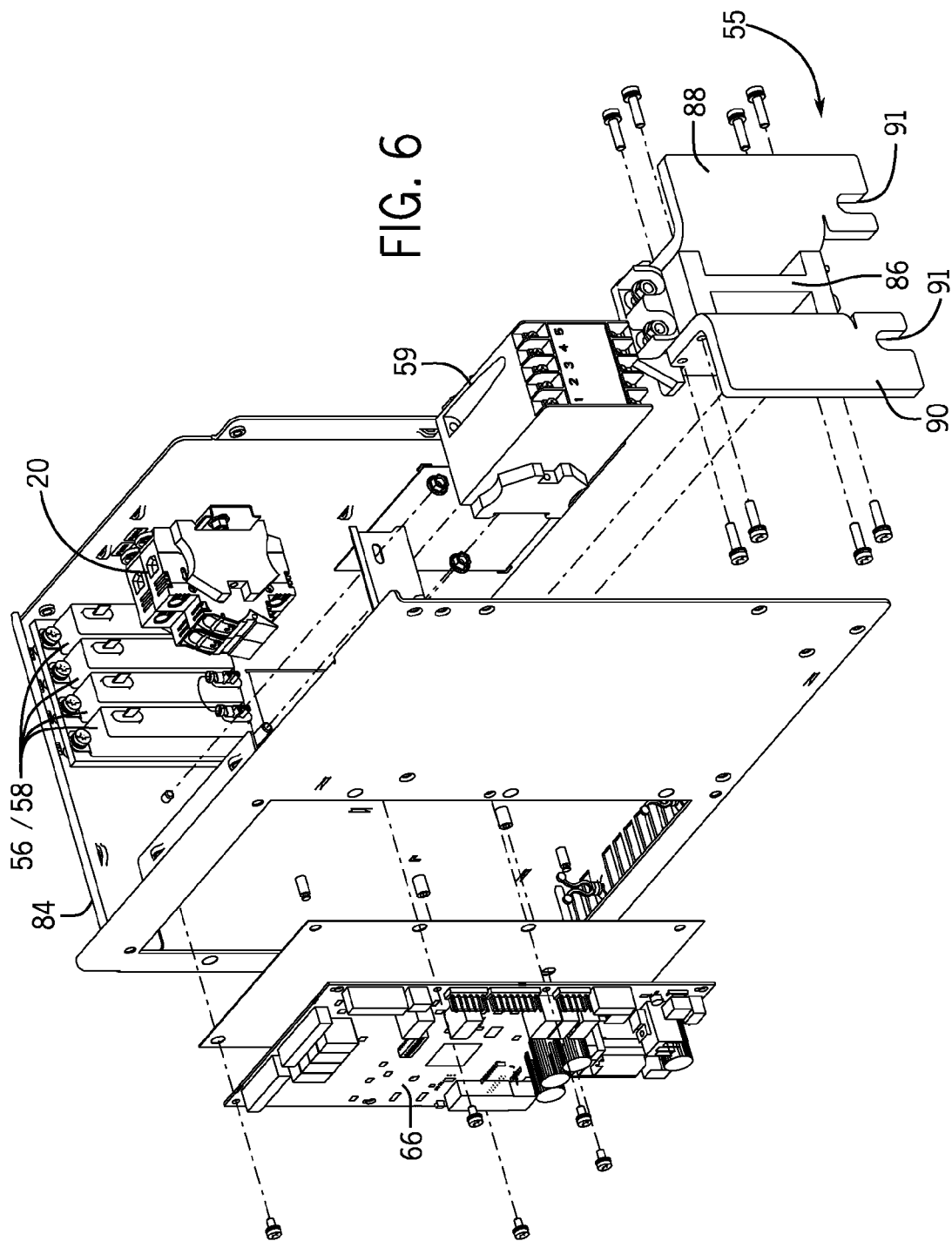
FIG. 6 is an exploded front perspective view of inner-components of the DC pre-charge module of FIG. 3, in accordance with an embodiment.
Figure 7:
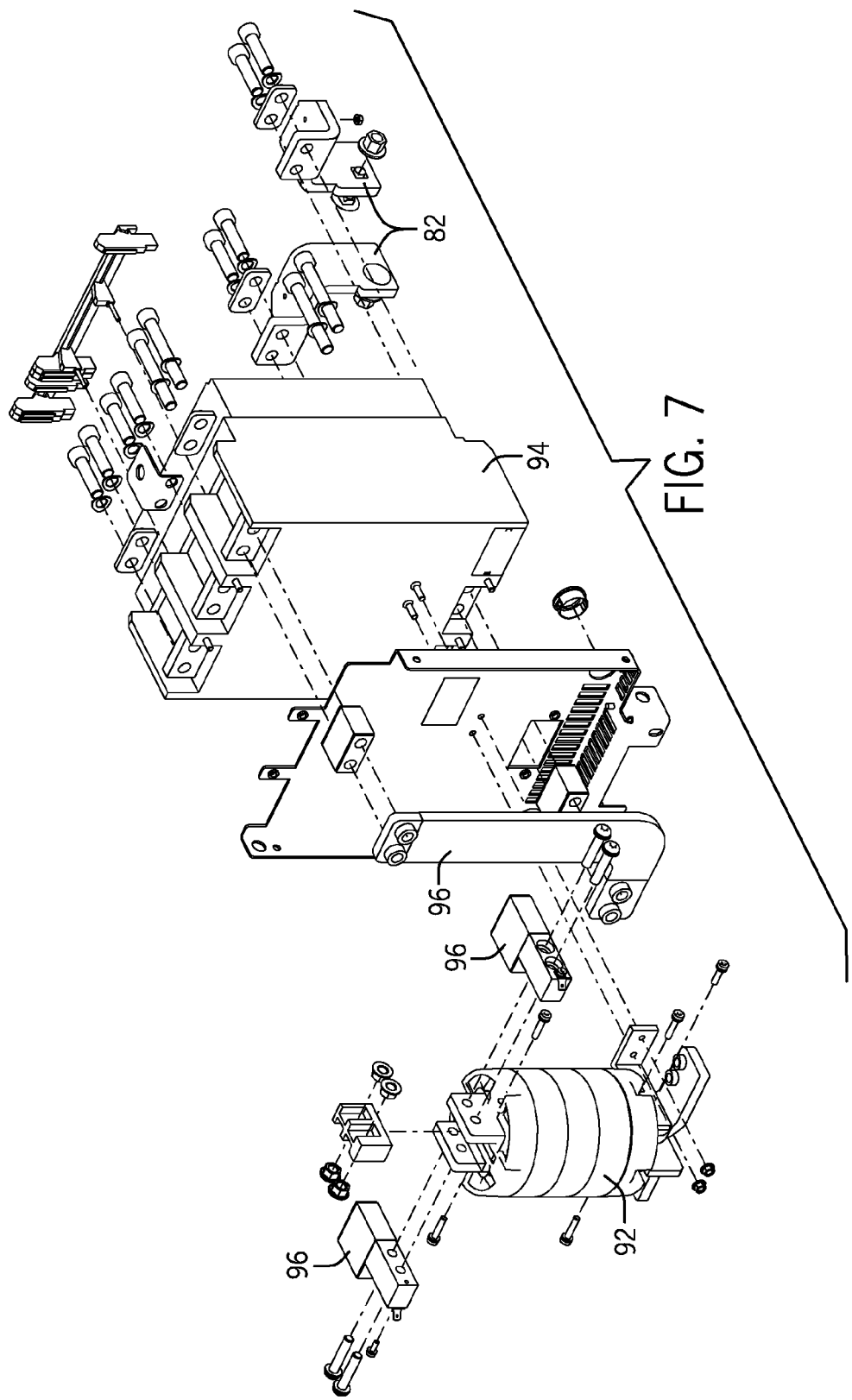
FIG. 7 is an exploded rear perspective view of a main circuit breaker and a common core choke that may be stored within the DC pre-charge module of FIG. 3, in accordance with an embodiment.
Figure 8:
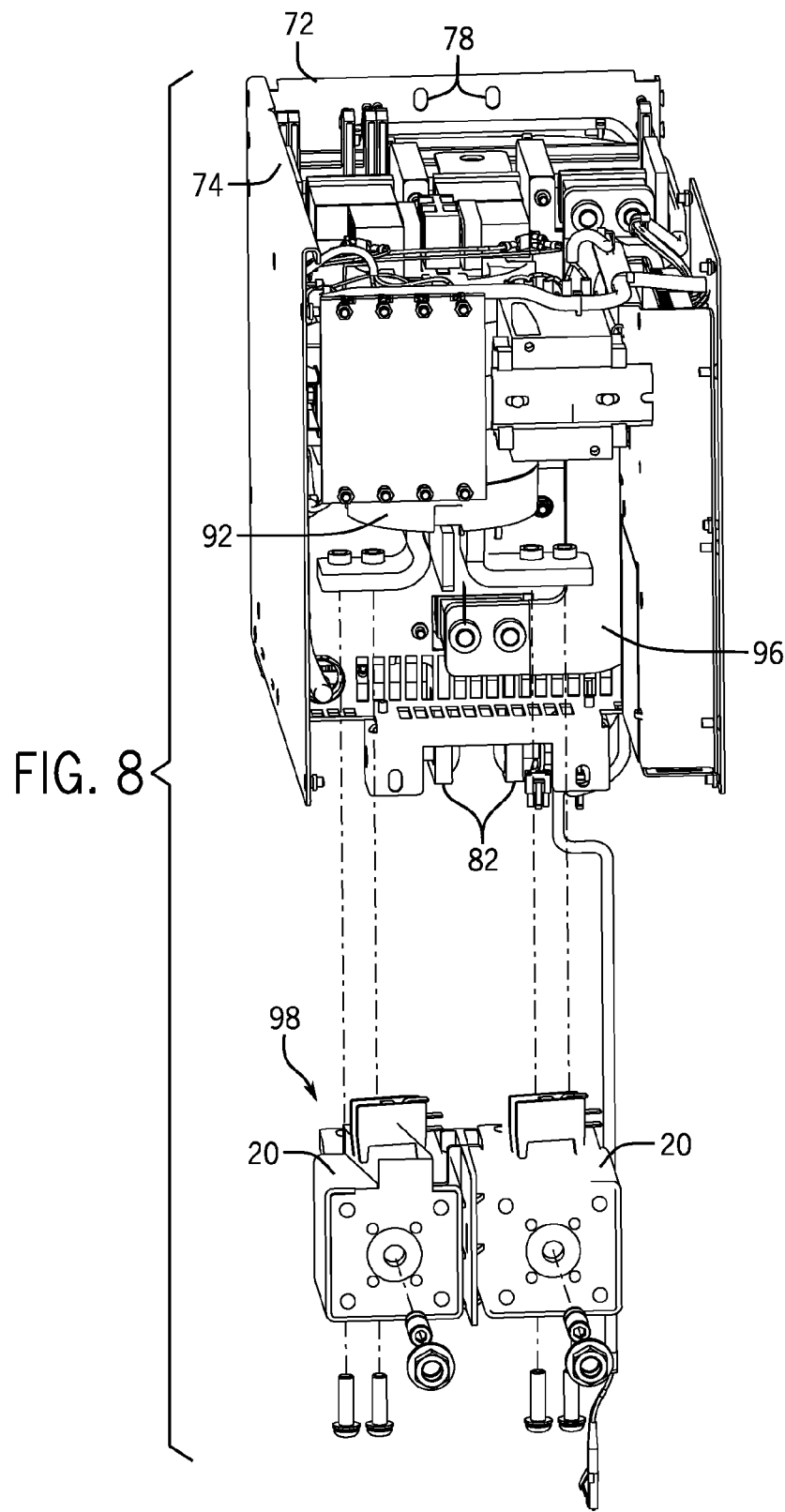
FIG. 8 is an exploded rear view of the DC pre-charge module of FIG. 3 with a pre-charge subassembly, in accordance with an embodiment.

As described above, the pre-charge circuitry 40 may be useful in protecting various components of the motor drive system. However, as with any kind of electrical component, many of the components of the pre-charge circuitry 40 may be replaced or serviced during the life of the pre-charge circuitry 40. To provide a user with more efficient ways to replace and maintain components of the pre-charge circuitry 40 or the pre-charge circuitry 40 itself, it may be beneficial to construct the pre-charge circuitry 40 in as a modular structure. More detailed explanations of various embodiments for implementing the pre-charge circuitry 40 in a modular structure are discussed in FIGS. 3-14. In particular, FIGS. 3-5 illustrate examples of exterior components that may be employed in the pre-charge modular structure. FIGS. 6-8 illustrate example ways in which interior components of the pre-charge modular structure may be positioned and assembled. Also, FIGS. 9-14 illustrate examples of how the pre-charge modular structure may be positioned within a power cabinet.

Beginning first with FIG. 3, a front perspective view of one embodiment of a DC pre-charge module 70 (i.e., pre-charge modular structure) is shown. As shown in FIG. 3, the DC-pre-charge module 70 may include a front cover 72 that may include labeling to identify a particular DC pre-charge module 70. The DC pre-charge module 70 may also include a slide out rail support 74 disposed on the top of the DC pre-charge module 70 at each side. The slide out rail supports 74 may provide a mechanism for the DC pre-charge module 70 to slide into and out of a power cabinet (not shown) via a sliding action by a user. In one embodiment, the user can place the DC pre-charge module 70 within the power cabinet by grabbing a handle 76 disposed on the front cover 72 and aligning the slide out rail supports 74 with a corresponding set of slide out rails (not shown), which may be disposed on a ceiling of the power cabinet. Once the slide out rail supports 74 are aligned with a corresponding set of slide out rails of the power cabinet, the user may push the module 70 towards a rear end of the power cabinet. Removal may be accomplished in a similar manner. That is, the user may grasp the handle 76 and pull the DC pre-charge module 70 in a direction toward a front of the power cabinet.

As may be understood from this illustrated embodiment, the DC pre-charge module 70 may be designed such that the power cabinet may have a high power density. A power density of an electric device may be measured by dividing horsepower of the device by a volume of the device. The high power density may indicate a level of compactness of the device, which may be useful when dealing with space constraints. Since a space holding the DC pre-charge module 70 may be limited, minimizing a size of the DC pre-charge module 70 may enable the power cabinet to have a high power density. In the illustrated embodiment, the power density of the DC pre-charge module 70 may be approximately 19,000 HP/m^3. Therefore, the size of the DC pre-charge module 70 may enable the power cabinet to have a sufficiently high power density to operate effectively within space constraints of the motor drive system.

Additionally, the DC pre-charge module 70 may include coupling points 78 on an upper portion of the front cover 72. The coupling points 78 may allow the user to secure the DC pre-charge module 70 to a structure or frame of the power cabinet. Coupling the DC pre-charge module 70 to the power cabinet may provide constant and adequate contact between inputs of the DC pre-charge module 70 and a power source interface, as will be discussed in greater detail later.

In some embodiments, the DC pre-charge module 70 may also include lockout-tagout points 80. The lockout-tagout points 80 may allow a user to determine whether or not the DC pre-charge module 70 may be coupled to any form of power (e.g., from input or output of DC pre-charge module 70). As such, correctly using the lockout-tagout points 80 may enable the user to electrically isolate the DC pre-charge module 70 by removing all potential energy sources from being electrically coupled to the DC pre-charge module 70. For example, the user may open a circuit breaker coupled between the power source and the DC pre-charge module 70 and place a lock at one of the lockout-tagout points 80 to ensure that another user does not close the respective breaker. In one embodiment, the lockout-tagout points 80 may be constructed to meet minimum Occupational Safety and Health Administration (OSHA) standards on the Control of Hazardous Energy. In the illustrated embodiment, the lockout-tagout points 80 are located at the breaker of the DC pre-charge module 70 as well as at a power system disconnect point.

Turning now to FIG. 4, the DC pre-charge module 70 may include an output 82 of the DC pre-charge module 70. The output 82 may provide a connection between the DC pre-charge module 70 and an inverter module (not shown), which, in at least one embodiment, may be positioned below the DC pre-charge module 70 in a power cabinet (not shown). The output 82 may couple the pre-charge circuitry 40 to the positive-side 34 and the negative-side 36 of the DC bus 32 of FIG. 3. Further, the output 82 of the DC pre-charge module 70 may provide the DC current to the capacitors 38 depicted in FIG. 2 located within the inverter module as discussed above.

Additionally, when the inverter module is slid into the power cabinet, an input of the inverter module may couple onto the output 82 of the DC pre-charge module 70. Once the input couples onto the output 82, a coupling device may secure the input to the output 82. The coupling device may be a screw system, a bolt and nut system, or the like. Further securing of the input to the output 82 may enable the DC pre-charge module 70 and the inverter module to remain coupled during normal operating conditions of the motor drive system. Additionally, the coupling device may allow a user to easily remove and replace various components stored within the power cabinet. That is, the coupling device may be loosened to enable the inverter module and the DC pre-charge module 70 to be separated from each other and removed from the power cabinet for field maintenance or replacement. A modular configuration of the DC pre-charge module 70 may thus allow for efficiency in servicing the motor drive system.

FIG. 5 illustrates a back view of an embodiment of the DC pre-charge module 70. As shown in FIG. 5, the slide out rail supports 74 may be present on both sides of the top of the DC pre-charge module 70. In one embodiment, each slide out rail support 74 may be an extension of a side-panel of a frame of the DC pre-charge module 70. The extension may be shaped as a semi-circle to provide a lip that may hang the DC pre-charge module 70 from a slide out rail disposed on the power cabinet (not shown). The slide-out rail supports 74 may allow a user to slide the DC pre-charge module 70 into or out of the power cabinet. The slide-out rail supports 74 may also assist in properly aligning the DC pre-charge module 70 within the power cabinet. Proper alignment within the power cabinet may enable the DC pre-charge module 70 to be placed in a position suitable for coupling the power inputs 55 of the DC pre-charge module 70 to a power source. Additionally, a back cover 84 may provide protection for inner-components of the DC pre-charge module 70 as well as another surface to provide support for various other inner-components.

The back view depicted in FIG. 5 also illustrates at least one embodiment of the power input 55 of the DC pre-charge module 70. The power input 55 may include a power stab guide 86, a negative stab 88, and a positive stab 90. The stabs 88 and 90 may be protrusions extending out from the rear of the DC pre-charge module 70. Further, the stabs 88 and 90 may be shaped in such a manner that each stab 88 and 90 may have a wide base and generally create a wedge with a blunt end. A wedge configuration may allow the stabs 88 and 90 to provide increased contact with a power plug of the power source as the power stabs 88 and 90 are pushed further against the power plug. The power input 55 may be guided into a power source by the power stab guide 86. The power stab guide 86 may be composed of plastic or any other non-conducting material. In at least one embodiment, the power source may interface with the power input 55 through a power plug of the power source. The power stab guide 86 may fit between two power stab guide receptors in the power plug. As such, the power stab guide 86 may fill a void or empty space between the power stab guide receptors. As the power stab guide 86 fits inside the void, the negative power stab 88 and the positive power stab 90 may be guided into a pair of stab receptors of the power plug.

Additionally, when the negative stab 88 and the positive stab 90 are coupled to the power source, they may receive power from the negative-side 36 and the positive-side 34 respectively of the DC bus 32. In one embodiment, the DC pre-charge module 70 may be coupled to the power source by pushing the negative stab 88 and the positive stab 90 into the stab receptors of the power plug. That is, when the DC pre-charge module 70 is pushed into the power cabinet via the slide-out rails 70, the negative stab 88 and the positive stab 90 may be pushed into the stab receptors of the power plug, which may be disposed inside the power cabinet. By using this sliding action to connect and disconnect the DC pre-charge module 70 to the power source and the inverter module, multiple DC pre-charge modules 70 may be made available to replace an existing DC pre-charge module 70 in the motor drive system, thereby allowing the replacement of the DC pre-charge module 70 to be accomplished with minimal system down-time.

FIG. 6 illustrates a front perspective view of a number of inner-components of one embodiment of the DC pre-charge module 70. Resistors 56 and 58, for example, may be coupled on an inner side of the back cover 84. Resistors 56 and 58 may correspond to the pre-charge resistors 56 and 58 shown in FIG. 2. As discussed above, the resistors 56 and 58 may enable the pre-charge control circuitry 66 to determine how the DC pre-charge module 70 may function at any given time. That is, the pre-charge control circuitry 66 may monitor the voltage drop across resistors 56 and 58 while the motor drive system is in a pre-charge mode and may determine a point at which the DC bus 32 has been sufficiently charged. In some embodiments, the point at which the DC bus 32 has been sufficiently charged may be when a bank of power-conditioning capacitors (e.g., capacitor 38) is charged to approximately 90 percent of a full source voltage provided by the DC power source. In at least one embodiment, by charging the bank of capacitors (e.g., capacitor 38) to approximately 90 percent of the full source voltage charge, the pre-charge circuit may sufficiently protect components of an inverter module from an in-rush current that may be received from the power source.

In addition, the power input 55 of the DC pre-charge module 70 is also illustrated in FIG. 6. As mentioned above, the power input 55 may consist of power stab guide 86, negative stab 88, and positive stab 90. In this illustration, the power input 55 extends through the back cover 84. A lower portion of the negative stab 88 and the positive stab 90 may include a recess region 91. The recess region 91 may provide a location for the power input 55 to couple with various components of the DC bus 32. By coupling the power input 55 to the DC bus 32, the pre-charge circuit 40 of the DC pre-charge module 70 may receive power from the power source.

Also illustrated in FIG. 6 is the pre-charge control circuitry 66. The pre-charge control circuitry 66 may be positioned along a side of the DC pre-charge module 70. In one embodiment, the pre-charge control circuitry 66 may be positioned to provide a maximum amount of space on the side of the DC pre-charge module 70. As such, more area within the DC pre-charge module 70 may be used for various components that may be included in the DC pre-charge module 70.

Additionally, FIG. 6 illustrates a set of fuses 20 and protective device 59 such as a relay. As shown in FIGS. 1 and 3, fuses 20 may be positioned in series with the automatic switches 60 and/or the manual switches 50. The protective deice 59, in one embodiment, may include an under-voltage relay that may function by triggering the pre-charge circuitry 40 when the voltage of the motor drive system drops below a pre-determined threshold. When the pre-charge control circuitry 66 detects such a situation via the protective device 59, the pre-charge control circuitry 66 may revert the pre-charge circuitry 40 to the pre-charge mode until the power source provides an appropriate voltage and the capacitors 38 are charged to an appropriate value.

FIG. 7 is a rear perspective view of one embodiment of interior components of the DC pre-charge module 70. This illustration shows how several different components of the DC pre-charge module 70 may be oriented in relation to one another. In the present embodiment, the output 82 of the DC pre-charge module 70 may be oriented along the bottom of the DC pre-charge module 70, such that it may couple with an input of an inverter module (not shown). The inverter module, as discussed above and further discussed below, may be positioned beneath the DC pre-charge module 70 in a power cabinet. In one embodiment, a common mode core 92 may be coupled to the output 82 of the DC pre-charge module 70. The common mode core 92 may function as a choke for common mode currents that may be output by the pre-charge circuit 40. As such, the common mode core 92 may be useful for limiting common mode currents or high frequency interference received by the pre-charge circuit 40 from the power source.

FIG. 7 also illustrates a main circuit breaker 94 that may be employed with the pre-charge circuit 40. The main circuit breaker 94 may be in communication with several components of the DC pre-charge module 70 such as the power input 55 and the output 82. The main circuit breaker 94 may function as a mechanism to protect components in the DC pre-charge module 70 from unexpected conditions such as a short circuit, an overloaded circuit, a ground fault, etc. Along with the main circuit breaker 94, bus work 96 may couple the common mode core 92 to the main circuit breaker 94. The bus work 96 may also couple the power source via the input 55 of the DC pre-charge module 70 to the inverter module via the output 82 of the DC pre-charge module 70.

FIG. 8 is an illustration of a rear view of an embodiment of the DC pre-charge module 70 without the back cover 84 and the power input 55. As shown in FIG. 8, the DC pre-charge module 70 may include a fuse sub-assembly 98, which may be removable from the DC pre-charge module 70 to allow efficient access to one or more fuses 20 located in the fuse sub-assembly 98. The fuse sub-assembly 98 may be coupled to and also removed from DC bus work 96 of the DC pre-charge module 70. As such, the fuse sub-assembly 98 may be removed from the DC pre-charge module 70 without having to open any enclosed portions of the DC pre-charge module 70. Once the fuse sub-assembly 98 is removed, fuses within the fuse sub-assembly may be replaced. The fuses 20 within the fuse sub-assembly 98 may provide load breaking for elements in the pre-charge circuit 40. For example, the fuses may be configured with a voltage rating of 480V or 690V depending on the motor drive system being employed. With easy removal of the fuse sub-assembly 98, the user may be capable of changing out fuses 20 in the DC pre-charge module 70 by simply replacing the fuse sub-assembly 98 with a new, substantially similar, or replacement fuse sub-assembly 98. As such, the fuse sub-assembly 98 may decrease an amount of down-time that the motor drive system may experience when a fuse is being replaced. Once the fuse sub-assembly 98 is removed from the DC pre-charge module 70, maintenance may include replacing the fuses 20 and returning the sub-assembly 98 to the DC pre-charge module. Further, the fuse sub-assembly 98 may provide the user an easier way to switch between fuse sub-assemblies 98. As such, the fuse sub-assembly 98 may allow for a quick transition between fuse types during a situation demanding this type of changeover.

Figure 9:
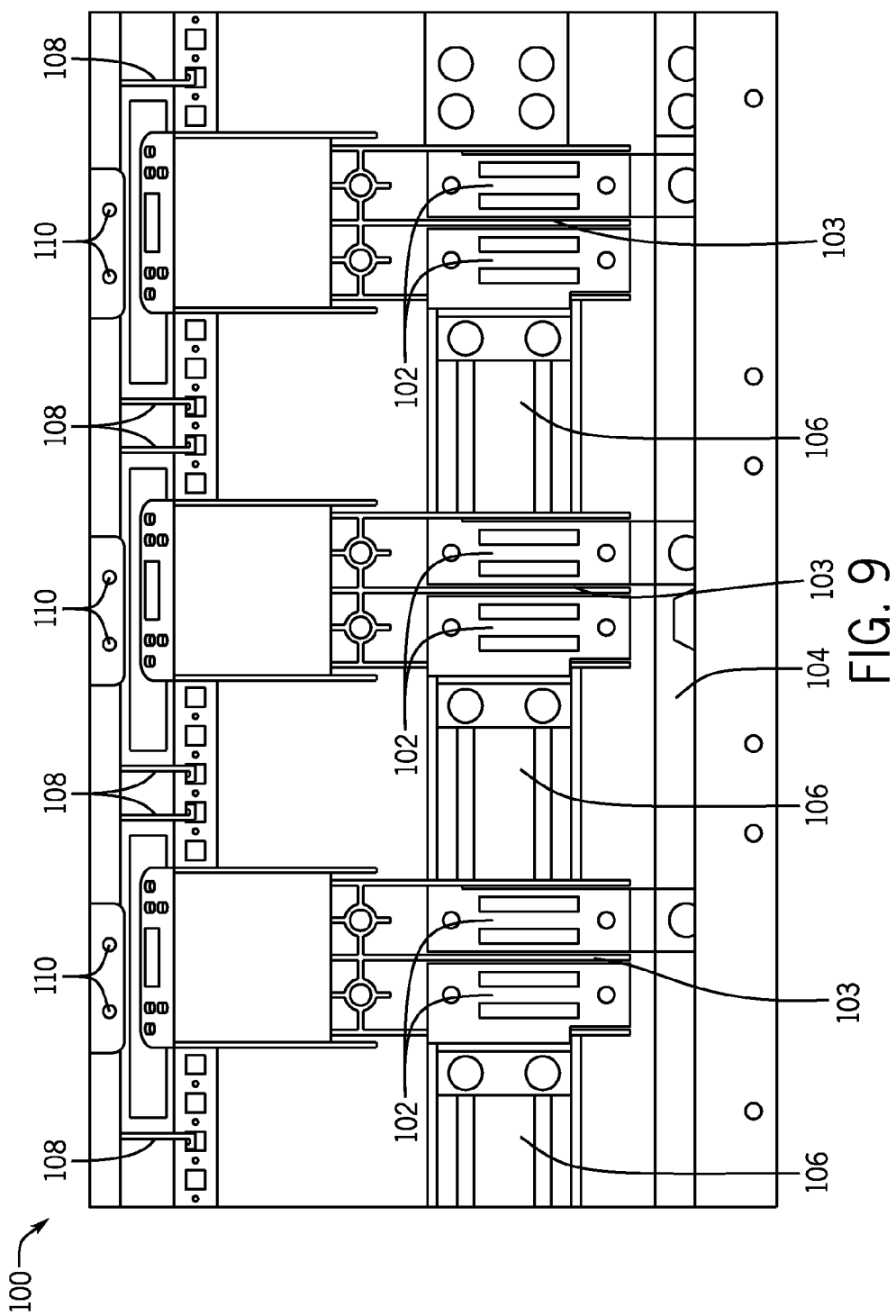
FIG. 9 is a front view of an inside portion of a power cabinet capable of receiving the DC pre-charge module of FIG. 3, in accordance with an embodiment.

Transitioning now to FIGS. 9-14, a positioning of the DC pre-charge module in relation to other components that make up the motor drive system will be discussed. In FIG. 9, a view of one embodiment of a DC pre-charge module receiver 100 within a power cabinet is illustrated. The receiver 100 may include a power fork plug 102 that may function as a power source interface for the power stabs 88 and 90. In other embodiments, the receiver 100 may include any type of power source interface that may be capable of interacting with power stabs 88 and 90. The power fork plug 102 may include two power fork elements. One of the elements may be coupled to the positive side 34 of the DC bus 32 while the other element may be coupled to the negative side 36 of the DC bus 32. As such, the two elements may receive the positive stab 90 and the negative stab 88, respectively.

In one embodiment, the power stab guide 86 may occupy a space 103 between the two power fork elements. The power stab guide 86 may assist in directing power stabs 88 and 90 into their respective positions within the power fork plug 102. Moreover, when the power stabs 88 and 90 are pushed into the power fork plug 102, the power stabs 88 and 90 may electrically couple to the power fork elements of the power fork 102, thereby electrically coupling the power source to the DC pre-charge module 70.

The power fork plug 102 may be coupled to the positive side 34 of a DC bus 32 and a negative side 36 of the DC bus 32 represented in FIGS. 1 and 2. The positive side 34 and negative side 36 may provide a power into the power cabinet and subsequently into the DC pre-charge module 70. As shown in FIG. 9, the power cabinet may receive three DC pre-charge modules 70 that may be coupled to three inverter modules. It should be noted, however, that a power cabinet may be configured to enclose any number of DC pre-charge modules 70.

Additionally, FIG. 9 illustrates multiple slide out rails 108 that may be part of the power cabinet. The slide out rails 108 may be located on a ceiling of the power cabinet. The slide out rails 108 may be configured to receive the slide out rail supports 74 of the DC pre-charge module 70 shown in FIGS. 3, 5, and 8. The interaction between the slide out rails 108 and the slide out rail supports 74 may allow the DC pre-charge module 70 to slide in to and out of the DC pre-charge receiver 100 via a sliding action by the user. The slide out rails 108, when interacting with slide out rail supports 74, may also suspend the DC pre-charge module 70 from the slide out rails 108 at the top of the power cabinet. For further securing the DC pre-charge module 70 within the power cabinet, coupling points 110 may be located on the power cabinet to enable fasteners to couple the DC pre-charge module 70 to the power cabinet. The coupling points 110 may align with coupling points 78 of the DC pre-charge module 70 shown in FIGS. 3-5. When the DC pre-charge module 70 is in place within the DC pre-charge receiver 100, a fastener may be inserted through coupling points 78 and 110 in order to keep the DC pre-charge module 70 securely fastened within the power cabinet. The fastener may include a screw system, a bolt and nut system, and the like.

Figure 10:
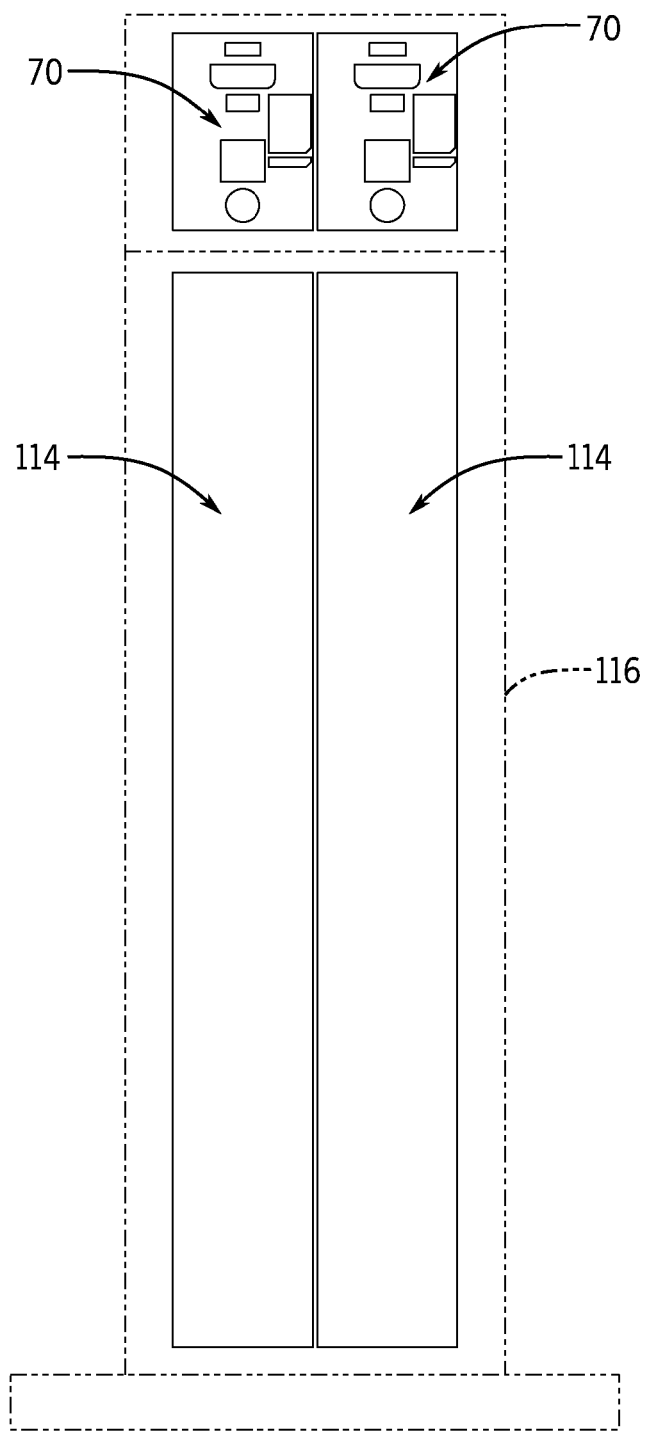
FIG. 10 is a front view of a power cabinet that may enclose two DC pre-charge modules and two inverter modules in position therein, in accordance with an embodiment.

FIG. 10 illustrates an embodiment with two DC pre-charge modules 70 and two inverter modules 114 within the power cabinet 116. As mentioned above, the power cabinet 116, in some embodiments, may hold more than two DC pre-charge modules 70 and inverter modules 114, or it may hold just one DC pre-charge module 70 and one inverter module 114. Additionally, in some embodiments, multiple power cabinets 116 may be used in parallel with each other in order to provide a sufficient amount of power for an appropriate number of motor drive systems.

Figure 11:
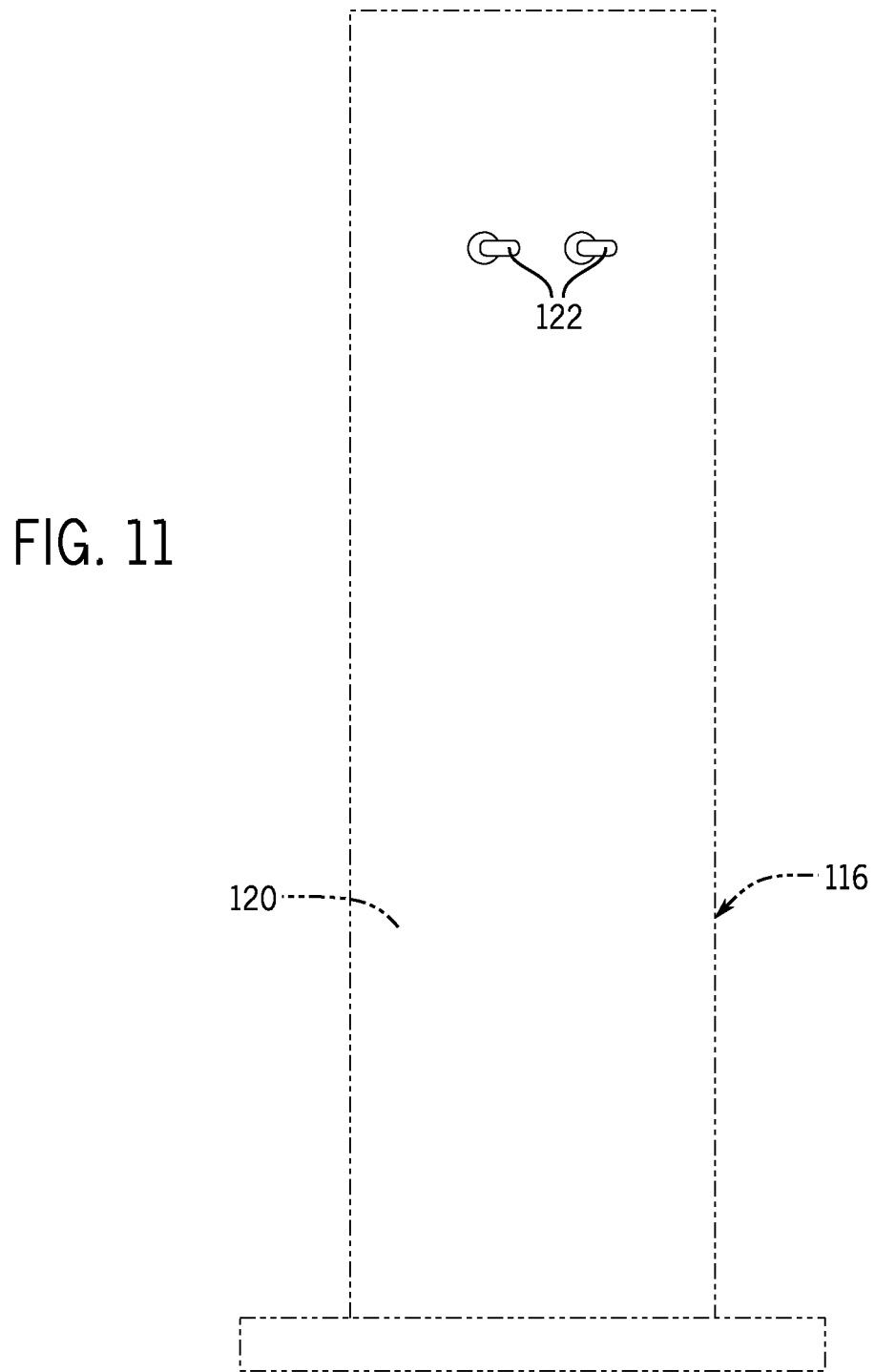
FIG. 11 is a front view of the power cabinet of FIG. 10 that may employ a power cabinet door, in accordance with an embodiment.

FIG. 11 shows a front cover 120 of an embodiment of a power cabinet 116. The front cover 120 provides an extra lockout-tagout point 122 for each of two DC pre-charge module and inverter module pairs within the power cabinet 116. Further, the front cover 120 may prevent any user interference on live parts within the power cabinet 116 during operation. Minimizing user interference thereby provides added safety to the operation of the DC pre-charge module 70 and inverter module 114.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An industrial automation device, comprising:
an enclosed module comprising:
 a pre-charge circuit configured to pre-charge a direct current (DC) bus configured to couple to an inverter;
 a power input having a positive stab and a negative stab configured to couple the pre-charge circuit to a DC power source; and
 an electrical output structure configured to couple the pre-charge circuit to an inverter, wherein the pre-charge circuit is configured to be removeably coupled to the inverter and the DC power source via a sliding action.

2. The device of claim 1, further comprising a power stab guide disposed between the positive stab and the negative stab, wherein the power stab guide is configured to guide positions of the positive stab and the negative stab to interface with the DC power source.

3. The device of claim 1, wherein the enclosed module comprises at least two slide out rail supports configured to receive at least two slide out rails disposed within a power cabinet.

4. The device of claim 3, wherein the power cabinet comprises a power interface configured to couple the positive power stab and the negative power stab to the DC power source via the sliding action.

5. The device of claim 3, wherein each of the at least two slide out rail supports comprise a semi-circle-shaped lip.

6. The device of claim 1, wherein the electrical output structure is configured to output a current to one or more capacitors coupled across the DC bus.

7. The device of claim 1, further comprising a pre-charge subassembly comprising one or more fuses configured to provide load breaking for one or more components of the pre-charge circuit.

8. The device of claim 7, wherein the pre-charge subassembly is configured to be removed from the enclosed module and replaced by a substantially similar pre-charge subassembly.

9. The device of claim 1, further comprising a common mode core configured to reduce high-frequency common mode currents, wherein the common mode core is configured to electrically couple to the electrical output structure.

10. A method, comprising:
sliding a modular device into a power cabinet thereby coupling a positive stab and a negative stab of the modular device to a power interface of a power source, wherein the modular device comprises a pre-charge circuit configured to pre-charge a direct current (DC) bus configured to couple to the power source and the modular device; and
sliding an inverter module into the power cabinet thereby coupling an input of the inverter module to an output of the modular device, wherein the inverter module comprises at least one capacitor configured to be charged via the pre-charge circuit, and wherein the at least one capacitor is coupled across the DC bus.

11. The method of claim 10, wherein sliding the modular device into the power cabinet comprises sliding the modular device on at least two slide out rails disposed within the power cabinet.

12. The method of claim 11, wherein the modular device comprises at least two slide out rail supports configured to receive the at least two slide out rails disposed within the power cabinet.

13. The method of claim 10, wherein the positive stab and the negative stab is guided into the power interface using a power stab guide disposed between the positive stab and the negative stab.

14. The method of claim 13, wherein the power stab guide comprises a non-conductive material.

15. The method of claim 10, wherein the modular device comprises one or more lockout-tagout locations disposed on a surface of the modular device.

16. A power system, comprising:
a pre-charge module comprising:
 a direct current (DC) pre-charge circuit configured to couple to a DC bus;
 a positive power stab and a negative power stab configured to couple the pre-charge module to a DC power source;
 at least two slide out rail supports; and an electrical output;
an inverter module comprising:
   an electrical input configured to couple to the electrical output of the pre-charge module;
   at least one capacitor configured to couple across the DC bus, wherein the DC bus is configured to be charged via the DC pre-charge circuit; and
   an inverter circuit; and
a power cabinet comprising:
   a power interface configured to receive the positive stab and the negative power stab;
   at least two slide out rails configured to receive the slide out rail supports of the pre-charge module; and
   a space configured to receive the pre-charge module and the inverter module.

17. The power system of claim 16, wherein the slide out rails are configured to suspend the pre-charge module from an upper portion of the power cabinet.

18. The power system of claim 16, wherein the power cabinet is configured to receive two or more pre-charge modules configured to couple to two or more inverter modules.

19. The power system of claim 16, wherein the two or more pre-charge modules coupled to the two or more inverter modules are configured to align within the power cabinet parallel with each other.

20. The power system of claim 16, wherein the pre-charge module is configured to provide a power density of at least approximately 19,000 HP/m^3.

\* \* \* \* \*